United States Patent
Nukiwa et al.

(10) Patent No.: US 6,396,155 B1
(45) Date of Patent: May 28, 2002

(54) SEMICONDUCTOR DEVICE AND METHOD OF PRODUCING THE SAME

(75) Inventors: Masaru Nukiwa; Makoto Iijima; Seiji Ueno; Muneharu Morioka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/605,086

(22) Filed: Jun. 27, 2000

(30) Foreign Application Priority Data

Sep. 16, 1999 (JP) ............................................ 11-262007

(51) Int. Cl.7 ............................................... H01L 23/48
(52) U.S. Cl. ........................................ 257/778; 257/785
(58) Field of Search ................................ 257/783, 775, 257/668, 778, 785, 780

(56) References Cited

U.S. PATENT DOCUMENTS

| 5,442,240 A | * | 8/1995 | Mukerji | 257/783 |
| 5,874,780 A | * | 2/1999 | Murakami | 257/775 |
| 5,892,271 A | * | 4/1999 | Takeda et al. | 257/668 |
| 6,137,183 A | * | 10/2000 | Sako | 257/783 |
| 6,137,184 A | * | 10/2000 | Ikegami | 257/785 |
| 6,153,938 A | * | 11/2000 | Kanda et al. | 257/778 |
| 6,177,730 B1 | * | 1/2001 | Kira et al. | 257/778 |

FOREIGN PATENT DOCUMENTS

JP          10-303252          11/1998

* cited by examiner

*Primary Examiner*—David Nelms
*Assistant Examiner*—Bau T Le
(74) *Attorney, Agent, or Firm*—Armstrong, Westerman & Hattori, LLP

(57) ABSTRACT

A semiconductor device includes a semiconductor element on which a plurality of bumps are formed and a substrate having a first surface on which a plurality of protruding electrodes are protrudingly formed in correspondence to an arrangement of the bumps, and a second surface on which balls serving as mounting terminals are formed. The semiconductor element is bonded in a face-down manner to the substrate with the protruding electrodes being embedded into the bumps. Alloy layers having materials identical to those of the bumps and the protruding electrodes are formed on interfaces of the bumps and the protruding electrodes.

11 Claims, 7 Drawing Sheets

SEMICONDUCTOR DEVICE AND METHOD OF PRODUCING THE SAME

BACKGROUND OF THE INVENTION

1. Field of the Invention

The present invention generally relates to semiconductor devices and methods of producing the same, and more particularly, to a semiconductor device having a semiconductor chip mounted on a substrate in a face-down manner and a method of producing the same.

For example, a semiconductor device having a BGA (Ball Grid Array) structure is provided with a semiconductor chip mounted and resin-sealed on an upper surface of a substrate and with solder balls serving as mounting terminals on a bottom surface of the substrate. As a method of mounting this semiconductor chip on the substrate, a wire bonding, by means of which the semiconductor chip is electrically bonded to the substrate in a face-up manner, and a face-down bonding, by means of which the semiconductor chip is mounted on the substrate in the face-down manner, are known.

Particularly, the face-down bonding can contribute to an improvement in the high frequency characteristic and the miniaturization of a semiconductor device since the face-down bonding requires neither wires nor a space for disposing the wires in the semiconductor device. On the other hand, the face-down bonding should be performed with reliability high enough to support the increasing number of the terminals of semiconductor chips with high density.

2. Description of the Related Art

FIG. 1 is a flowchart showing a conventional method of producing a semiconductor device wherein the face-down bonding is employed to mount a semiconductor chip having solder bumps on a substrate.

This method of producing the semiconductor device proceeds as follows.

First, the solder bumps are formed on an active circuit surface of the semiconductor chip by an evaporation method or the like, and flux is applied to bonding pads of the substrate. Then, at step S10 (the word "step" is simply referred to as "S" in the diagrams), the semiconductor chip is bonded to the substrate in the face-down manner so that each of the solder bumps will be mounted on the corresponding bonding pad. Thus, the semiconductor chip is temporarily mounted on the substrate by the flux.

Next, a reflow soldering process is performed at step S11, wherein the semiconductor chip temporarily mounted on the substrate by the flux is put in a reflow furnace so that the solder bumps of the semiconductor chip will be melted and fixed to the corresponding bonding pads of the substrate. After this reflow soldering process, a cleaning process to remove residual flux and a drying process are performed at step S12 so that the semiconductor chip will be fixed to the substrate.

At step S13, an underfill resin made of, for example, an epoxy resin or the like is interposed between the semiconductor chip and the substrate, and next, at step S14, a thermosetting process to harden this underfill resin is performed.

Further, at step S15, solder balls are attached to corresponding external terminals formed on a bottom surface (a surface opposite to the surface on which the semiconductor chip is mounted) of the substrate, and finally, at step S16, another reflow soldering process is performed so that the solder balls will be melted and joined to the corresponding external terminals.

Conventionally, the semiconductor devices having the solder bumps for use as bumps have been produced in the above described method including steps S10 through S16.

On the other hand, FIG. 2 is a flowchart showing a conventional method of producing a semiconductor device wherein the face-down bonding is employed to mount a semiconductor chip having gold bumps on a substrate.

This method of producing the semiconductor device proceeds as follows.

First, at step S20, a conductive resin such as silver paste is applied to a top end of each of the gold bumps, and next, at step S21, the semiconductor chip is bonded to the substrate in the face-down manner with heat and load being applied thereto.

Then, at step S22 after the semiconductor chip is bonded to the substrate in the face-down manner at step S21, an underfill resin made of, for example, an epoxy resin or the like is interposed between the semiconductor chip and the substrate. Thereafter, at step S23, a thermosetting process to harden this underfill resin is performed.

Further, as in the method shown in FIG. 1, solder balls are attached to corresponding external terminals formed on a bottom surface of the substrate at step S24, and are joined to the corresponding external terminals by a reflow soldering at step S25. The semiconductor devices having the gold bumps for use as bumps have been produced in the above described method including steps S20 through S25.

Moreover, Japanese Laid-Open Patent Application No. 10-303252 discloses a semiconductor device having a reinforced connection between pad electrodes and bump electrodes. In this semiconductor device, a convex portion having a smaller diameter than the bump electrode of the semiconductor chip is formed on each of the pad electrodes, and is pressed into the corresponding bump electrode so as to realize the reinforced connection therebetween.

However, according to the conventional production method as shown in FIG. 1, wherein solder is employed as material for the bumps formed on the semiconductor chip, time for melting the solder bumps and adhering the melted solder bumps to the substrate is necessary, and further, a reflow process is required so as to keep the steady figures of the solder bumps.

Moreover, since flux is employed in the temporary mounting of the solder bumps on the corresponding bonding pads of the substrate, a cleaning process to remove residual flux is needed after the reflow process. For the above reasons, this production method has been precluded from achieving efficiency and thus has required a long time in producing semiconductor devices, entailing the problem of a rise in the production cost thereof.

Further, the conventional production method as shown in FIG. 2, wherein the semiconductor chip is bonded to the substrate by means of the gold bumps having silver paste on the top ends thereof, has also taken a long time in producing semiconductor devices because the silver paste requires time for applying heat thereto so as to be hardened when the semiconductor chip is bonded to the substrate.

In addition, as a semiconductor chip has higher density, the number of bumps formed on the semiconductor chip is on the rise with the result that the individual bumps become smaller in size. The downsizing of the individual bumps makes it difficult to securely interpose an underfill resin between the semiconductor chip and the substrate as the space therebetween becomes narrower when the semiconductor chip is mounted on the substrate. Unless the underfill resin is securely interposed therebetween, there rises the problem of the lowered yield rate and reliability of the semiconductor device since a stress resulting from a difference in coefficient of thermal expansion between the semiconductor chip and the substrate is applied to the bumps, so that the bumps are detached from the semiconductor chip.

SUMMARY OF THE INVENTION

It is a general object of the present invention to provide a semiconductor device and a method of producing the same in which the above disadvantages are eliminated.

A more specific object of the present invention is to provide a semiconductor device having a greater reliability in the connections between bumps and protruding electrodes and a method of producing such a semiconductor device with more efficiency.

The above objects of the present invention are achieved by a semiconductor device including a substrate having a first surface on which a plurality of protruding electrodes are protrudingly formed in correspondence to an arrangement of a plurality of bumps formed on a semiconductor element, and a second surface on which balls serving as mounting terminals are formed, the semiconductor element being bonded in a face-down manner to the substrate with the protruding electrodes being embedded into the bumps, and alloy layers having materials identical to those of the bumps and the protruding electrodes formed on interfaces of the bumps and the protruding electrodes.

By embedding the protruding electrodes into the bumps, the protruding electrodes break through oxide films to reach inside the bumps even though the oxide films are formed to cover the surfaces of the bumps. Therefore, the electrical connections between the bumps and the protruding electrodes can be prevented from being deteriorated by the oxide films. Further, the alloy layers having the materials identical to those of the bumps and the protruding electrodes formed on the interfaces therebetween can enhance both of the mechanical and the electrical connections therebetween.

The above objects of the present invention are also achieved by a method of producing a semiconductor device including the steps of embedding protruding electrodes formed on a first surface of a substrate into bumps formed on a semiconductor element, interposing an insulating resin between the semiconductor element and the substrate, and applying heat having temperature equal to or higher than respective melting points of the bumps and balls serving as mounting terminals formed on a second surface of the substrate so as to form alloy layers on interfaces of the bumps and the protruding electrodes and simultaneously to form the balls on the second surface of the substrate.

In the embedding step, the protruding electrodes formed on the substrate are embedded into the bumps formed on the semiconductor element. At this point, no heat treatment or the like is provided, and the protruding electrodes are mechanically embedded into the bumps by simply applying a pressing force (load) so that the bumps and the protruding electrodes will temporarily be joined. Thus, as the semiconductor element is bonded to the substrate in the face-down manner without requiring time for the heat treatment, the face-down bonding can be performed in a short time.

Further, by interposing the insulating resin between the semiconductor element and the substrate in the resin-interposing step, the semiconductor element is fixed to the substrate and the connecting positions of the protruding electrodes and the bumps are also reinforced by the insulating resin.

Moreover, applying heat having temperature equal to or higher than respective melting points of the bumps and the balls in the heat application step so as to form the alloy layers on the interfaces of the bumps and the protruding electrodes and simultaneously to form the balls on the substrate can save time and work in the whole production process and reduce the production costs so that semiconductor devices with high performance can be supplied to the market at inexpensive prices.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given of a preferred embodiment of the present invention with reference to the accompanying drawings.

Figure 3:
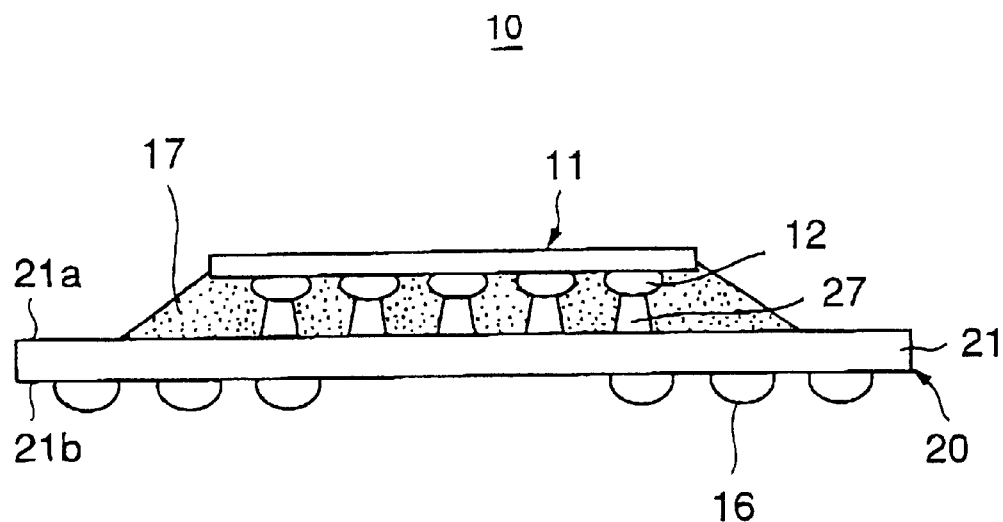
FIG. 3 is a cross sectional view of a semiconductor device according to an embodiment of the present invention.

FIG. 3 is a cross sectional view of a semiconductor device 10 according to the embodiment of the present invention. The semiconductor device 10 has a BGA (Ball Grid Array) structure and includes a semiconductor chip 11, solder balls 16, an underfill resin 17, a substrate 20 and so on.

The semiconductor chip 11 has high density and is provided with a plurality of electrode portions formed on an active circuit surface thereof (a bottom surface thereof in the drawing). A plurality of solder bumps 12 are formed on the corresponding electrode portions by, for example, an evaporation method.

In the present embodiment, solder, which is an alloy of a tin-lead system, is employed as material for the bumps. It is also possible, however, to substitute for solder an alloy having a composition of a lead-tin system, a tin-silver system, a tin-silver-copper system, a tin-silvercopper-bismuth system, a tin-silver-bismuth system, or a tin-bismuth system.

The substrate 20 includes, for example, a filmy, organic type insulating substrate 21 and protruding electrodes 27 protruding therefrom in an upward direction, that is, in a direction to face the semiconductor chip 11 to be mounted.

The organic type insulating substrate 21 has a sheet shape. An organic type resin such as a polyimide resin or the like is selected as material fit therefor. The above described protruding electrodes 27 penetrate through this organic type insulating substrate 21 to protrude in the upward direction from an upper surface 21a of the organic type insulating substrate 21. The protruding electrodes 27 are electrically coupled to corresponding wiring layers 28 (not shown in FIG. 3. See FIGS. 9G and 9H) formed on a bottom surface 21b of the organic type insulating substrate 21.

The material for this organic type insulating substrate 21 is not limited to an organic type resin, and can be replaced, for example, with an organic type substrate such as a printed plate board, or with an inorganic type substrate such as an alumina substrate, a glass ceramic substrate, or an aluminum nitride substrate.

The protruding electrodes 27, as described later, are formed on the organic type insulating substrate 21 by, for example, a plating method. Any one of copper, nickel, and gold, for example, is selected as material for the protruding electrodes 27, and any selected material therefor is harder than the above described solder bumps 12.

Each of the protruding electrodes 27 is shaped like a cone, a truncated cone, or the like, of which the diameter size becomes smaller toward a top end portion thereof. Further, each of the protruding electrodes 27 is so formed as to have a smaller diameter size at least at the top end portion than the diameter size of the above described solder bump 12, and the height thereof is set to 10 $\mu$m or higher, measured from the upper surface 21a of the organic type insulating substrate 21.

The protruding electrodes 27 of the above described structure are so disposed as to correspond to the positions of the solder bumps 12 formed on the semiconductor chip 11, and, as described later, are embedded into the corresponding solder bumps 12 so as to electrically be connected thereto.

The solder balls 16, which function as mounting terminals, include the same material as the above described solder bumps 12, and the solder balls 16 and the solder bumps 12 have the substantially identical melting points, accordingly. Further, the solder balls 16 are joined to the wiring layers 28 formed on the bottom surface 21b of the organic type insulating substrate 21, through which layers the solder balls 16 are electrically connected to the protruding electrodes 27.

The underfill resin 17 is interposed between the semiconductor chip 11 and the substrate 20 so as to protect the connecting positions, or the embedding positions, of the solder bumps 12 and the protruding electrodes 27.

That is to say, unless the underfill resin 17 is interposed therebetween, the connecting positions thereof may be damaged because a stress resulting from a difference in coefficient of thermal expansion between the semiconductor chip 11 and the substrate 20 is exerted intensively on the above connecting positions in the case of heat application. Therefore, by interposing the underfill resin 17, the above stress is prevented from being exerted intensively on the connecting positions of the solder bumps 12 and the protruding electrodes 27, which leads to the enhanced reliability of the semiconductor device 10.

An organic type insulating resin such as a thermosetting epoxy resin, a cyanate ester resin, a polyimide resin, a silicon resin, or the like may be employed as material for this underfill resin 17.

A description will now be given of the connecting positions, or the embedding positions of the solder bumps 12 and the protruding electrodes 27 of the semiconductor device 10 having the above described structure with reference to FIG. 4.

Figure 4:
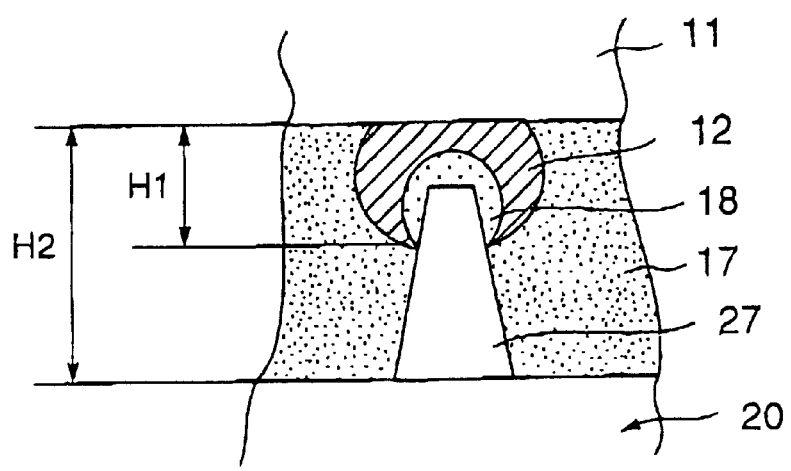
FIG. 4 is a diagram showing an enlarged cross sectional view of a connecting position of a solder bump and a protruding electrode of the semiconductor device of FIG. 3.

FIG. 4 is a diagram showing an enlarged cross sectional view of each of the connecting positions, or the embedding positions, of the solder bumps 12 and the protruding electrodes 27. As shown in FIG. 4, according to the present embodiment, each of the protruding electrodes 27 is embedded into the corresponding solder bump 12 so as to electrically be connected thereto.

Oxide films are formed to cover the surfaces of the solder bumps 12 by providing heat treatment when the solder bumps 12, as described above, are formed on the semiconductor chip 11. As these oxide films are insulating films, electrical connections between the solder bumps 12 and the protruding electrodes 27 are deteriorated if the solder bumps 12 are simply put in contact with the protruding electrodes 27.

In the present embodiment, however, the protruding electrodes 27 are embedded into the solder bumps 12, breaking through the oxide films formed to cover the surfaces thereof. Therefore, the electrical connections between the solder bumps 12 and the protruding electrodes 27 can be secured without being deteriorated by the oxide films.

As the solder bumps 12 are made of softer material than the protruding electrodes 27, the protruding electrode 27 are easily embedded into the solder bumps 12. Therefore, the protruding electrodes 27 can securely be embedded into the solder bumps 12 simply by pressing the semiconductor chip 11 toward the substrate 20, which also secures the electrical connections between the solder bumps 12 and the protruding electrodes 27.

The protruding electrodes 27 having the above described heights can easily be formed in a short time by the above mentioned plating method. As a plated bump is harder than, for example, a sintered-paste bump or the like, the protruding electrodes 27 can securely be embedded into the solder bumps 12.

Further, in the above described configuration, a distance between the semiconductor chip 11 and the substrate 20 after the bonding (indicated by an arrow H2 in FIG. 4) can be set longer than a distance between a semiconductor chip and a substrate in a configuration wherein solder bumps are directly bonded to the substrate, for the protruding electrodes 27 are embedded into the solder bumps 12. In other words, if each of the solder bumps 12 is directly bonded to the substrate 20 without the protruding electrode 27 in FIG. 4, the maximum length of a distance between the semiconductor chip 11 and the substrate 20 will be equal to the height of each of the solder bumps 12 (indicated by an arrow H1 in FIG. 4), which is shorter than the distance H2 formed in the present embodiment (H2>H1).

Therefore, according to the present embodiment, the underfill resin 17 can securely be interposed between the semiconductor chip 11 and the substrate 20, for the distance H2 therebetween can be set longer in comparison with a conventional configuration wherein a semiconductor chip is bonded in the face-down manner to planar electrodes formed on a substrate even though pitches between the solder bumps 12 become narrower as the semiconductor chip 11 has higher density. Hence, even in the case of the semiconductor chip 11 with higher density, the electrical connections between the solder bumps 12 and the protruding electrodes 27 can securely be maintained so as to enhance the reliability of the semiconductor device 10.

The protruding electrodes 27 are not limited to plated bumps formed by the plating method, and can be stud bumps using a wire bonder. When the stud bumps are used for the protruding electrodes 27, the protruding electrodes 27 can be formed in a far shorter time than in the above described case wherein the plated bumps are used. Further, the height of each of the protruding electrodes 27 can be set to any value by piling up a plurality of the stud bumps in layers, or by a similar method.

A further attention will now be paid to an interface between each of the solder bumps 12 and each of the protruding electrodes 27 with reference to FIG. 4. An alloy layer 18 is formed on the interface therebetween. This alloy layer 18 is an alloy formed by melting each of the solder bumps 12 by applying heat thereto when the solder balls 16 are formed on the substrate 20.

That is, in the present embodiment, as described above, the solder bumps 12 and the solder balls 16 reach the respective melting points almost at the same temperature because the solder bumps 12 and the solder balls 16 are made of the same material. Therefore, when the solder balls 16 are melted by heat applied thereto so as to be formed on the substrate 20, the solder bumps 12 are also melted by the same heat, so that the alloy layers 18 are formed between the solder bumps 12 and the protruding electrodes 27 embedded thereinto.

Thus, the alloy layers 18 having the materials identical to those of the solder bumps 12 and the protruding electrodes 27 are formed on the interfaces between the solder bumps 12 and the protruding electrodes 27, which leads to the enhancement of both mechanical and electrical connections therebetween.

Further, the alloy layers 18 do not include an impurity since the protruding electrodes 27, as described above, are embedded into the solder bumps 12, breaking through the oxide films formed to cover the surfaces thereof, which also leads to the enhancement of both mechanical and electrical connections therebetween.

Moreover, as described above, the alloy layers 18 are formed by melting the solder bumps 12 by applying heat thereto when the solder balls 16 are formed on the substrate 20. Therefore, the process of forming the alloy layers 18 on the interfaces between the solder bumps 12 and the protruding electrodes 27 and the process of forming the solder balls 16 on the bottom surface 21b of the substrate 20 can simultaneously be performed. Thus, the production process of the semiconductor device 10 can be simplified.

A description will now be given of a method of producing the semiconductor device 10 having the above described structure.

Figure 5:
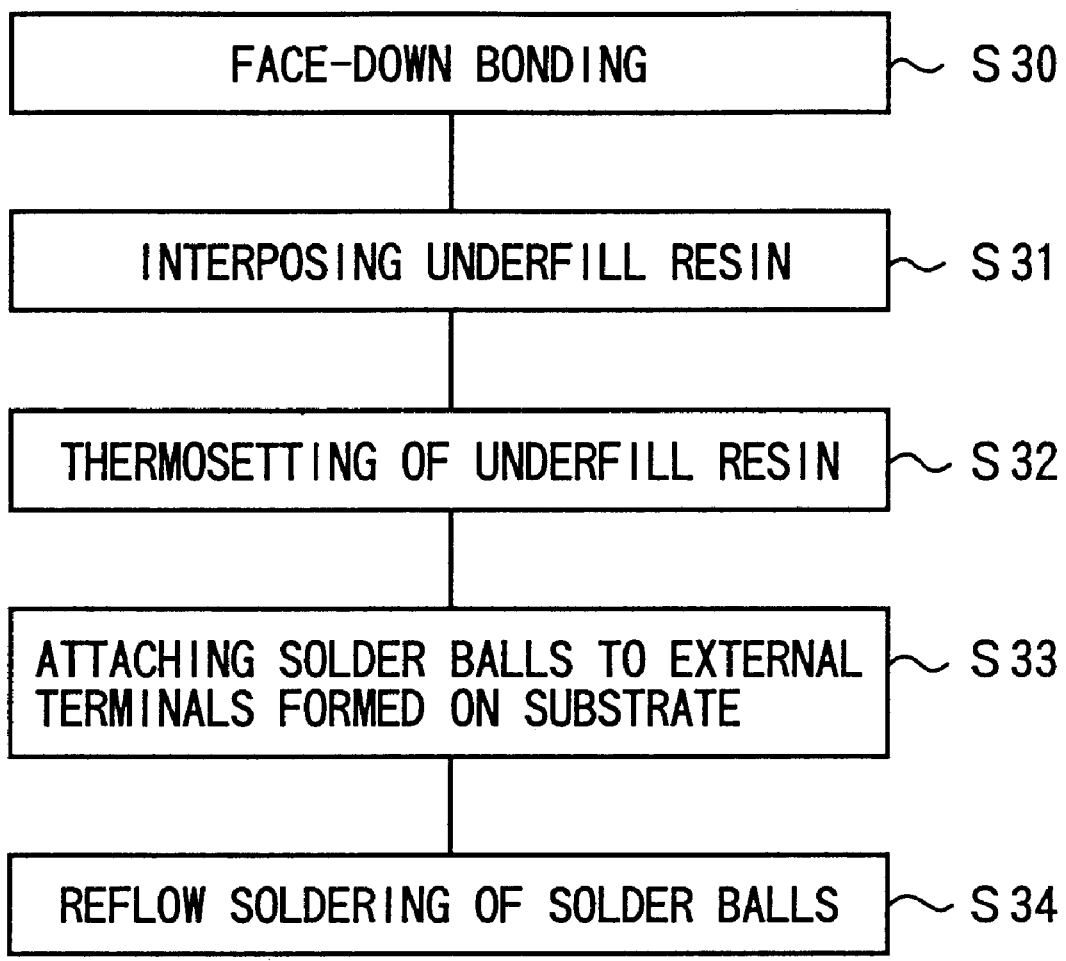
FIG. 5 is a flowchart showing a method of producing the semiconductor device according to the embodiment of the present invention.

FIG. 5 is a flowchart showing a method of producing the semiconductor device 10 according to the embodiment of the present invention. FIGS. 6 through 9H are diagrams showing specific steps of producing the semiconductor device 10.

Figure 6:
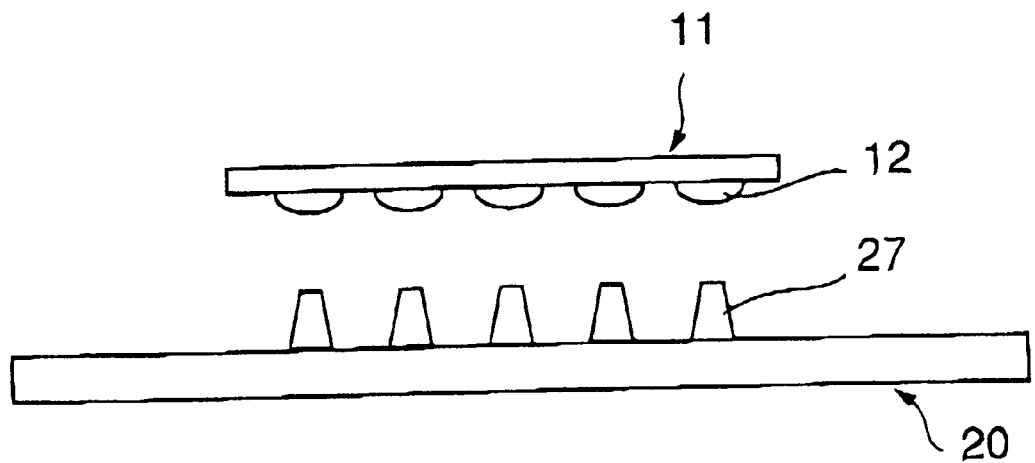
FIGS. 6 and 7 are diagrams illustrating an embedding step of the method of producing the semiconductor device according to the embodiment of the present invention.

As shown in FIG. 6, the semiconductor chip 11 with the solder bumps 12 formed thereon by, for example, the evaporation method and the substrate 20 with the protruding electrodes 27 formed thereon should first be prepared for producing the semiconductor device 10. A description will first be given of a method of producing the substrate 20 with the protruding electrodes 27 formed thereon with reference to FIGS. 9A through 9H.

The method of producing the substrate 20 proceeds as follows.

Figures 9A, 9B, 9C, 9D, 9E, 9F, 9G, 9H:
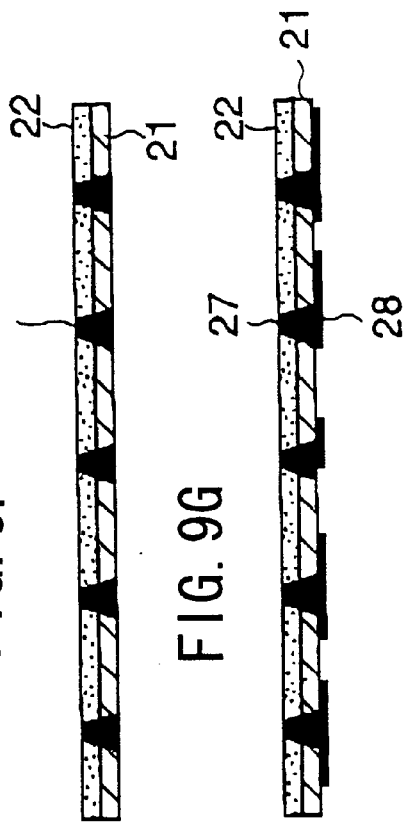
FIGS. 9A through 9H are diagrams no illustrating a method of producing a substrate used for producing the semiconductor device according to the embodiment of the present invention.

First, the organic type insulating substrate 21 and a filmy adhesive 22 are prepared as shown in FIG. 9A, and the filmy adhesive 22 is joined adhesively to the organic type insulating substrate 21 as shown in FIG. 9B. Then, apertures 23 are formed from the side of the organic type insulating substrate 21 by means of a laser processing apparatus, penetrating both of the organic type insulating substrate 21 and the filmy adhesive 22. As shown in FIG. 9C, the apertures 23 are shaped like truncated cones.

Next, as shown in FIG. 9D, a metal layer 25 is laid adhesively on top of the filmy adhesive 22 after the apertures 23 are formed as described above. This metal layer 25, which is a conductive metal film such as a copper film or the like, is so disposed as to cover the apertures 23. The organic type insulating substrate 21 and the filmy adhesive 22, on top of which the metal layer is adhesively laid, are sunk into a plating tank (not shown), and an electrolytic plating is performed therein with the metal layer 25 serving as an electrode.

Thus, vias 26 are formed within the respective apertures 23 by the electrolytic plating as shown in FIG. 9E. With respect to material used for forming the vias 26 by the electrolytic plating, any one of copper, nickel, or gold is selected as described above. The vias 26 are shaped like truncated cones in accordance with the shapes of the apertures 23.

When the vias 26 are formed within the respective apertures 23, the metal layer 25 is removed as shown in FIG. 9F so that the protruding electrodes 27 will be formed (the vias 26 after the metal layer 25 is removed are referred to as protruding electrodes in the present embodiment). Then, as shown in FIG. 9G, the wiring layers 28 are formed on the bottom surface of the organic insulating substrate 21 in a predetermined pattern. These wiring layers 28 are connected to the corresponding protruding electrodes 27 and are provided with the solder balls 16 in a below described heat application process.

When the wiring layers 28 are formed on the bottom surface of the organic insulating substrate 21 as described above, the filmy adhesive 22 is removed as shown in FIG. 9H. Thereby, the substrate 20, wherein the protruding electrodes 27 protrude from the upper surface of the organic insulating substrate 21, is produced. In the method of producing the semiconductor device 10 according to the present embodiment, the substrate 20 produced in the above described method is employed.

Figure 7:
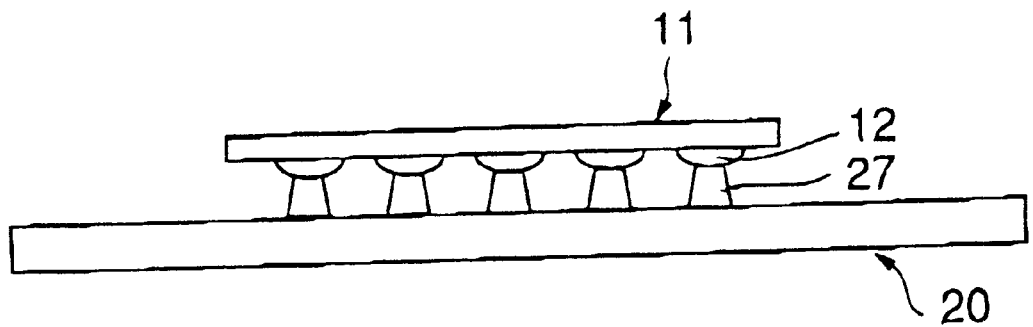
Figure 8:
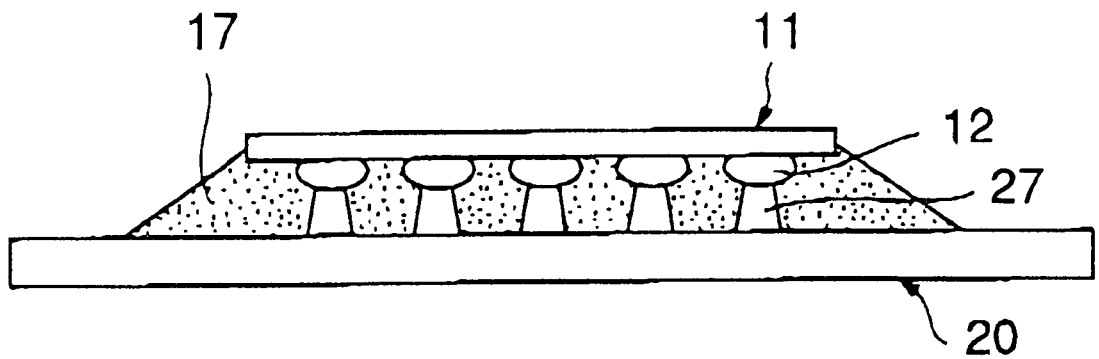
FIG. 8 is a diagram illustrating a resin-interposing step of the method of producing the semiconductor device according to the embodiment of the present invention.

A description will now be given of the method of producing the semiconductor device 10 with reference to FIGS. 5, 7 and 8.

The above described semiconductor chip 11 is bonded to the substrate 20 in the face-down manner. Thereby, as shown in FIG. 7, the protruding electrodes 27 formed protrudingly on the substrate 20 are embedded into the solder bumps 12 formed on the semiconductor chip 11 at Step 30 (this process is referred to as an embedding step).

At this point, the protruding electrodes 27 can easily be embedded into the solder bumps 12 by pressing the semiconductor chip 11 toward the substrate 20 with a predetermined pressing force (load) since the solder bumps 12 are made of softer material than the protruding electrodes 27. Further, the semiconductor chip 11 is temporarily fixed on the substrate 20 by embedding the protruding electrodes 27 into the solder bumps 12.

In the present embodiment, no heat treatment is provided during the face-down bonding. In other words, the protruding electrodes 27 are mechanically embedded into the solder bumps 12 and the semiconductor chip 11 and the substrate 20 are temporarily joined by simply applying a pressing force (load). Thus, as the heat treatment is not provided when the semiconductor chip 11 is bonded to the substrate 20 in the face-down manner, time for the heat treatment can be omitted and the face-down bonding can be performed in a short time, accordingly.

After step S30, the underfill resin 17 is interposed between the semiconductor chip 11 and the substrate 20 at step S31, and thereafter, a thermosetting process to harden this underfill resin 17 is performed at step S32. Hereinafter, the processes of steps S31 and S32 are referred to as a resin-interposing step.

By performing this resin-interposing step, the semiconductor chip 11 is more firmly fixed to the substrate 20, and the connecting force between the protruding electrodes 27 and the solder bumps 12 is also reinforced.

Next, at step S33, the solder balls 16 are attached to the corresponding wiring layers 28 (see FIG. 9H) formed on a bottom surface (a surface opposite to the surface on which the semiconductor chip 11 is mounted) of the substrate 20, and at Step 34, a reflow soldering process is performed so that the solder balls 16 will be joined to the corresponding wiring layers 28. Hereinafter, the processes of steps S33 and S34 are referred to as a heat application step.

In this heat application step, by providing reflow soldering (applying heat) to the solder balls 16, the solder bumps are also melted as described above, and the alloy layers 18 are formed on the interfaces of the solder bumps 12 and the protruding electrodes 27. Further, the solder bumps 12 are prevented from being deformed when the solder bumps 12 are melted because the connecting positions of the solder bumps 12 and the protruding electrodes 27 are covered with the underfill resin 17.

Performing simultaneously the process of forming the alloy layers 18 on the interfaces of the solder bumps 12 and the protruding electrodes 27 and the process of forming the solder balls 16 on the substrate 20 in the heat application step as described above can save time and work in the whole production process and reduce the production costs so that semiconductor devices with high performance can be supplied to the market at inexpensive prices.

Figure 1:
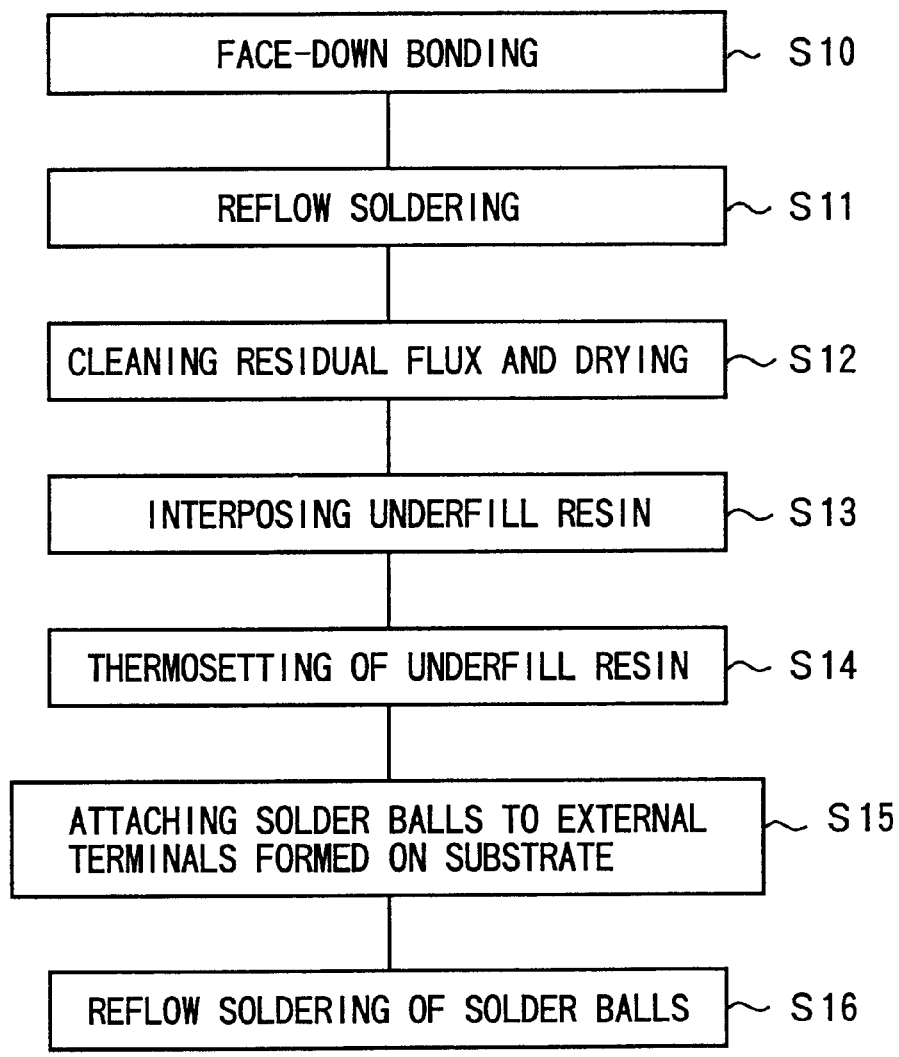
FIG. 1 is a flowchart showing a conventional method of producing a semiconductor device.
Figure 2:
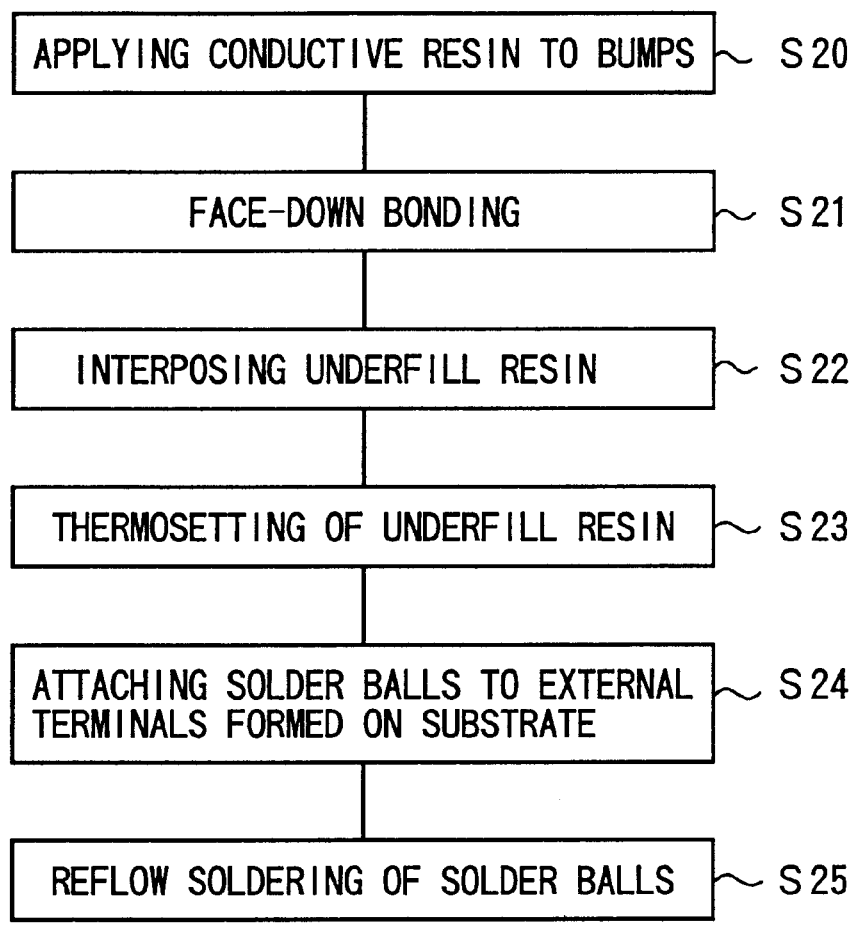
FIG. 2 is a flowchart showing another conventional method of producing a semiconductor device.

Further, compared with the conventional production method previously shown in FIG. 1, the production method according to the present embodiment shown in FIG. 5 does not require the reflow soldering process (step S11), the cleaning process to remove residual flux and the drying process (step S12) which are conventionally required, which can contribute to the simplification of the production process. Moreover, compared with the conventional production method previously shown in FIG. 2, the production method according to the present embodiment shown in FIG. 5 does not require the process of applying a conductive resin to the bumps (step S20) and the heat treatment during the face-down bonding process (step S21) which are conventionally required, which can contribute to the simplification of the production process.

Although the solder bumps 12 and the solder balls 16 include the same material in the above described embodiment, the materials of a bump and a ball are not necessarily required to be the same. Different materials can be employed for the bump and the ball as far as the materials have a substantially identical melting point.

The present invention is not limited to the specifically disclosed embodiment, and variations and modifications may be made without departing from scope of the present invention.

The present application is based on Japanese priority application no. 11-262007 filed on Sep. 16, 1999, the entire contents of which are hereby incorporated by reference.

What is claimed is:

1. A semiconductor device comprising:
   a substrate having a first surface on which a plurality of protruding electrodes are protrudingly formed in correspondence to an arrangement of a plurality of bumps formed on a semiconductor element, and a second surface on which balls serving as mounting terminals are formed, said semiconductor element being bonded in a face-down manner to said substrate with said protruding electrodes being embedded into said bumps; and
   alloy layers comprising materials identical to those of said bumps and said protruding electrodes formed on interfaces of said bumps and said protruding electrodes; and
   wherein said alloy layers are formed by applying heat after said protruding electrodes are connected to the bumps.

2. The semiconductor device as claimed in claim 1, wherein said bumps and said balls have a substantially identical melting point at which said bumps and said balls can simultaneously be joined to the semiconductor element and to the second surface of the substrate, respectively.

3. The semiconductor device as claimed in claim 2, wherein said bumps comprise softer material than said protruding electrodes.

4. The semiconductor device as claimed in claim 3, comprising an insulating resin interposed between said semiconductor element and said substrate.

5. The semiconductor device as claimed in claim 2, wherein said protruding electrodes comprise top end portions having smaller diameters than said bumps.

6. The semiconductor device as claimed in claim 2, comprising an insulating resin interposed between said semiconductor element and said substrate.

7. The semiconductor device as claimed in claim 1, wherein said bumps comprise softer material than said protruding electrodes.

8. The semiconductor device as claimed in claim 7, wherein said protruding electrodes comprise top end portions having smaller diameters than said bumps.

9. The semiconductor device as claimed in claim 7, comprising an insulating resin interposed between said semiconductor element and said substrate.

10. The semiconductor device as claimed in claim 1, wherein said protruding electrodes comprise top end portions having smaller diameters than said bumps.

11. The semiconductor device as claimed in claim 1, comprising an insulating resin interposed between said semiconductor element and said substrate.

* * * * *